(12) United States Patent
Amigues et al.

(10) Patent No.: US 12,166,193 B2
(45) Date of Patent: Dec. 10, 2024

(54) ELECTRODE PRODUCTION PROCESS

(71) Applicant: GELION TECHNOLOGIES PTY LTD, Eveleigh (AU)

(72) Inventors: Adrien Amigues, Abingdon (GB); Jacob Locke, Abingdon (GB); William Richardson, Abingdon (GB)

(73) Assignee: GELION TECHNOLOGIES PTY LTD, Eveleigh (AU)

( * ) Notice: Subject to any disclaimer, the term of this patent is extended or adjusted under 35 U.S.C. 154(b) by 0 days.

(21) Appl. No.: 17/996,691

(22) PCT Filed: Apr. 19, 2021

(86) PCT No.: PCT/GB2021/050930
§ 371 (c)(1),
(2) Date: Oct. 20, 2022

(87) PCT Pub. No.: WO2021/214437
PCT Pub. Date: Oct. 28, 2021

(65) Prior Publication Data
US 2023/0223508 A1 Jul. 13, 2023

(30) Foreign Application Priority Data

Apr. 20, 2020 (GB) ...................... 2005747

(51) Int. Cl.
| | |
|---|---|
| *H01M 4/04* | (2006.01) |
| *B05D 1/32* | (2006.01) |
| *C23C 14/04* | (2006.01) |
| *C23C 16/04* | (2006.01) |
| *H01M 4/36* | (2006.01) |
| *H01M 4/38* | (2006.01) |

(Continued)

(52) U.S. Cl.
CPC ....... *H01M 4/0404* (2013.01); *H01M 4/0419* (2013.01); *B05D 1/32* (2013.01); *C23C 14/04* (2013.01); *C23C 16/04* (2013.01); *H01M 4/36* (2013.01); *H01M 4/38* (2013.01); *H01M 4/66* (2013.01); *H01M 4/75* (2013.01); *H01M 10/052* (2013.01)

(58) Field of Classification Search
CPC .... H01M 4/0404; H01M 4/0419; H01M 4/36; H01M 4/38; H01M 4/66; H01M 4/75; H01M 10/052; B05D 1/32; C23C 14/04; C23C 16/04
USPC ........................................ 427/125
See application file for complete search history.

(56) References Cited

U.S. PATENT DOCUMENTS

| | | | |
|---|---|---|---|
| 6,733,924 B1 | 5/2004 | Skotheim et al. | |
| 7,066,971 B1 * | 6/2006 | Carlson | H01M 50/406 |
| | | | 429/231.9 |

(Continued)

FOREIGN PATENT DOCUMENTS

| | | |
|---|---|---|
| EP | 1 234 348 B1 | 10/2003 |
| JP | H11-67208 A | 3/1999 |

*Primary Examiner* — Brian K Talbot
(74) *Attorney, Agent, or Firm* — BakerHostetler

(57) ABSTRACT

A method for forming at least one electrode, said method comprising: a) providing an electronically conductive, inert material; b) cutting the substrate material to form at least one current collector; c) placing at least one current collector on a carrier; d) applying one or more protection layers to one or both sides of the current collector to form a coated electrode; and e) removing the electrode from the carrier.

7 Claims, 6 Drawing Sheets

(51) Int. Cl.
   *H01M 4/66*     (2006.01)
   *H01M 4/75*     (2006.01)
   *H01M 10/052*   (2010.01)

(56) References Cited

U.S. PATENT DOCUMENTS

| | | | |
|---|---|---|---|
| 7,081,142 B1* | 7/2006 | Carlson | H01M 50/414 |
| | | | 429/231.9 |
| 8,679,677 B1* | 3/2014 | Tamaki | H01M 10/0445 |
| | | | 429/234 |
| 2002/0086213 A1 | 7/2002 | Utsugi et al. | |
| 2009/0165710 A1 | 7/2009 | Kee et al. | |
| 2011/0091754 A1* | 4/2011 | Miyahisa | H01M 50/46 |
| | | | 429/94 |
| 2014/0162108 A1 | 6/2014 | Visco et al. | |
| 2014/0220233 A1* | 8/2014 | Huang | H01M 50/461 |
| | | | 427/58 |
| 2014/0287318 A1* | 9/2014 | Hippchen | H01M 4/0404 |
| | | | 429/233 |
| 2015/0170947 A1 | 6/2015 | Bluck et al. | |
| 2016/0318061 A1* | 11/2016 | Yeh | H01L 21/67109 |
| 2017/0229731 A1 | 8/2017 | Visco et al. | |
| 2020/0014025 A1* | 1/2020 | Zagars | H01M 4/0404 |
| 2021/0126247 A1* | 4/2021 | Herle | C23C 14/14 |
| 2021/0277514 A1* | 9/2021 | Kaneko | C23C 14/50 |
| 2022/0115705 A1* | 4/2022 | Kovalev | H01M 10/052 |

* cited by examiner

ELECTRODE PRODUCTION PROCESS

CROSS-REFERENCE TO RELATED APPLICATIONS

This application is the National Stage of International Patent Application No. PCT/GB2021/050930, filed Apr. 19, 2021, which claims the benefit of Great Britain Application No. 2005747.7, filed Apr. 20, 2020, the entire contents of both of which are incorporated herein by reference.

The present invention relates to a method of forming an electrode. The present invention also relates to a metal electrode.

BACKGROUND

Electrodes comprising alkali and alkaline earth metals have been used in both primary and secondary electrochemical cells. In particular, lithium has been found to be a desirable material for use in the formation of electrodes, as it is a lightweight material that can provide a high specific energy. This can enable construction of cells that are suitable for a wide range of applications, including those where minimising the weight of the cell is of great importance. In a lithium-sulphur cell, for instance, lithium metal foil may be used as a negative electrode, or anode. The electrode may comprise an alkali metal foil absent a separate current collector. Alternatively, an electrode may comprise a current collector coated with an alkali metal foil, wherein the electrode is placed in electrical contact with a current collector. Alternatively, an electrode may not contain an alkali metal, but alkali metal may be incorporated into the electrode (for example, by electrodeposition, intercalation or alloying) during cell cycling.

Cells comprising alkali metal in the anode, for example in the form of a metal or metal alloy foil, or in the form of a coating (for example, an electrodeposited plating layer) on a current collector, may be subject to the reaction of said alkali metal with the bulk electrolyte phase present within electrochemical cells, which may form a resistive layer at the interface between the anode and the bulk electrolyte phase that may decrease battery performance over time, and may also result in the formation of alkali metal dendrites/mossy deposits during cycling. This can result in short-circuiting and decreased cycling performance. Cells based on alternative anodes (not comprising alkali metal prior to cycling) may not initially suffer from these problems, a layer of alkali metal may nevertheless be formed on the surface of the anode during cycling, and as alkali metal is plated on the surface, dendrites may also be formed. Thus, the performance and/or lifetime of such cells may also be affected.

Thus, preventing degradation associated with such electrodes may be advantageous. This may be achieved by the application of one or more protection layers on the surface of an electrode. Exemplary protection layers may include alloy layers or ceramic layers. However, production of such coated electrodes may be problematic. For example, cutting a metal foil to form an electrode, after application of a coating to the metal foil, may result in damage such as cracks in the protection layer or layers, thus reducing the effectiveness of the protection layer. This may have a consequent effect on lifetime and cyclability of a cell, for example.

In one method of producing electrodes, a roll-to-roll process is used, which involves starting with a reel of substrate material, unwinding the material to apply the desired coating layer or layers, followed by re-winding the coated foil onto another reel. Stretching during a roll-to-roll process may result in potential damage in the protection layer or layers, which may ultimately result in unprotected regions.

BRIEF DESCRIPTION OF FIGURES

Various aspects of the invention are described, by way of example, with reference to the accompanying figures, in which.

DESCRIPTION

Figure 1:
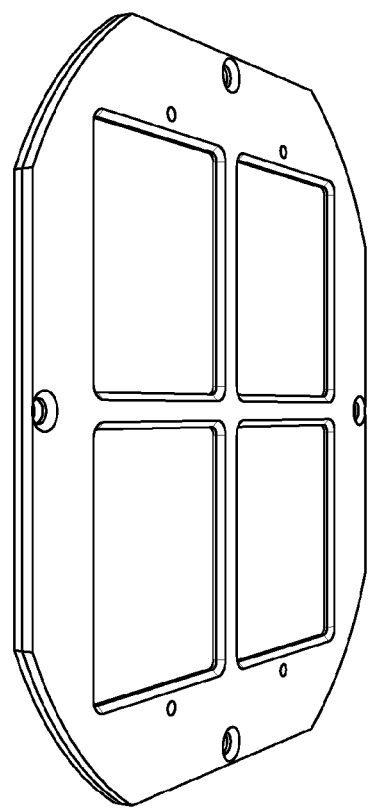
FIG. 1 depicts a carrier used in accordance with an embodiment of the present invention, wherein both sides of the carrier are shown.
Figure 1:
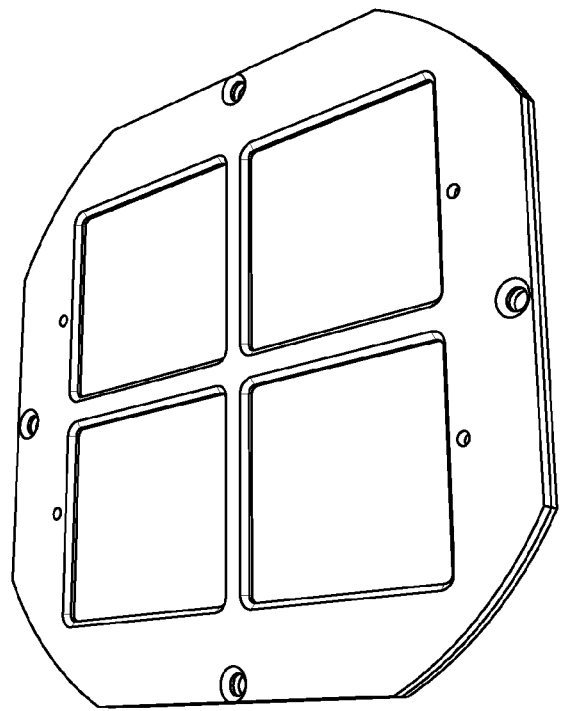

Before particular examples of the present invention are described, it is to be understood that the present disclosure is not limited to the particular cells, methods or materials disclosed herein. It is also to be understood that the terminology used herein is used for describing particular examples only and is not intended to be limiting, as the scope of protection will be defined by the claims and equivalents thereof.

In describing and claiming the cell and method of the present invention, the following terminology will be used: the singular forms "a", "an" and "the" include plural forms unless the context clearly dictates otherwise. Thus, for example, "a cathode" includes reference to one or more of such elements.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

In accordance with one aspect of the invention, there is provided a method for forming one or more electrodes, said method comprising:
  i) providing an electronically conductive, inert material;
  ii) cutting the substrate material to form at least one current collector;
  iii) placing at least one current collector on a carrier;
  iv) applying one or more protection layers to one or both sides of the current collector to form a coated electrode; and
  v) removing the electrode from the carrier.

In accordance with another aspect of the invention, there is provided a method for forming at least one electrode, said method comprising:

i. providing an electronically conducting, inert material;
ii. placing the electronically conducting, inert material on a carrier, wherein at least one side of the material is overlapped by either part of the carrier or by a mask, such that the region or regions that are not overlapped by the carrier or mask define the electrochemically active zone of at least one electrode;
iii. coating at least one side of the material with one or more protection layers, such that the regions overlapped by the carrier and/or mask are not coated;
iv. removing the material from the carrier; and
v. cutting the coated material to form one or more electrodes, wherein each of said electrodes have an electrochemically active zone coated with one or more protection layers, and wherein the material is cut along the uncoated regions.

In accordance with a further aspect of the invention, there is provided a cell comprising one or more electrodes obtainable by one of the methods detailed herein.

In step a) or step i) of the method as described herein, an electronically conductive, inert material is provided as a substrate material. This may comprise an electronically conducting, inert metal or non-metal. Any material that is suitable to form the current collector of an electrode may be employed. For example, the current collector may typically be composed of a metallic conductor that is substantially inert, i.e. the metallic conductor does not participate in reduction or oxidation reactions during cycling of the cell. For example, the current collector may not be formed of an alkali metal such as lithium or sodium. Examples of suitable metals for formation of the current collector include inert metals such as aluminium, copper, nickel, titanium, iron or tungsten. Alloys of any of said metals may also be employed. For example, the current collector may comprise stainless steel. In a preferred example, the current collector comprises copper or nickel, for example copper or nickel foil. The current collector may also comprise a non-metal substrate, such as a polymer substrate. For example, the substrate may take the form of a polymer such as polyethylene terephthalate (PET). Thus, suitable electronically conductive, inert materials include metals such as aluminium, copper, nickel, titanium or tungsten, and non-metals such as polymers (for example PET). Current collectors comprising carbon may also be envisaged. The material may take the form of a sheet or foil.

In one embodiment, the step of providing a current collector comprises unrolling a section of a suitable substrate material from a reel. For example, a reel of electronically conducting, inert metal foil may be employed. In another embodiment, a reel of non-metal material such as a polymer film may be employed.

For the avoidance of doubt, where "metal foil" is referred to throughout the specification, this may be understood as referring to a metal foil comprised of any suitable metal, for example a metal foil selected from an inert metal such as aluminium, copper, nickel, titanium or tungsten. "Metal foil" is understood to cover foils comprising metals, alloys of said metals, or combinations thereof.

Any suitable thickness of substrate material suitable for forming a current collector may be employed. The thickness may be dependent on the application of the resulting electrode, and may be between 5 to 200 µm, preferably between 5 µm and 40 µm, more preferably between 10 µm and 25 µm, for example between 15 µm and 20 µm. In one embodiment, the substrate material is a metal foil that may be a thin film i.e. have a thickness of between 5 µm to 150 µm, preferably between 10 µm to 100 µm, for example between 20 µm to 30 µm. Alternatively, any suitable thickness of polymer film may be employed as the substrate material. This may have a thickness of between 5 and 200 µm, for example between 10 and 100 µm.

In one embodiment, the current collector of an electrode formed in accordance with the present invention is coated with a layer of alkali metal or alkaline earth metal. This layer may take the form of a plating layer applied or deposited by, for example, electrodeposition. In a preferred embodiment, a substrate material that is coated with a layer of alkali or alkaline earth metal is supplied on a reel. This alkali or alkaline earth metal coating may act as the electrode active material and participate in reduction and oxidation reactions during cell cycling. Preferably, the current collector is coated with a layer of lithium metal or lithium metal alloy. Alternatively, the current collector may be coated with a layer of sodium metal or sodium metal alloy, or magnesium metal or magnesium metal alloy. In a preferred embodiment, both sides of the current collector are coated with a layer of alkali metal or alkaline earth metal.

In an alternative embodiment, the current collector comprises a material which is alloyable i.e. forms an alloy with an alkali metal or alkaline earth metal, such as lithium, sodium or magnesium, or forms a compound with said alkali or alkaline earth metal. The term "alloy" refers to a combination of two or more metals, or a combination of one or more metals with other, non-metallic elements. Examples of suitable alloying metals and non-metals include aluminium, gallium, boron, indium, zinc, carbon, silicon, germanium, tin, lead, antimony, silver, gold, sodium, potassium, magnesium, calcium, and mixtures thereof. Example of base lithium alloys that may be formed during cell cycling include $Li_nAl_x$, $Li_nZn_x$, $Li_nGa_x$, $Li_nIn_x$, $Li_nC_x$, $Li_nC_x$, $Li_nSi_x$, $Li_nGe_x$, $Li_nSn_x$, $Li_nPb_x$, $Li_nSb_x$, $Li_nAg_x$, $Li_nAu_x$, $Li_nNa_x$, $Li_nK_x$, $Li_nMg_x$, $Li_nCa_x$, wherein n may be between 0.1 and 20, for example between 1 and 5, and x may be between 0.5 and 10, for example between 1 and 5. For example lithium-indium alloys may include $Li_{0.3}In_{1.7}$, LiIn, $Li_5In_4$, $Li_3In_2$, $Li_2In$ and $Li_{13}In_3$, but further alloys may additionally/alternatively be formed. One or more base metal alloys may be formed. In a preferred embodiment, the alloy comprises a lithium-indium alloy, or a lithium-zinc alloy.

In step b) of the method described herein, the substrate material is cut to produce one or more current collectors. Cutting may be performed by any suitable method. Examples of methods for cutting of the current collectors include laser cutting, or mechanical cutting such as die cutting or rotary knife slitting.

In one embodiment, the substrate material is cut to form one or more current collectors before the application of a protection layer or layers. The size of the resulting electrode is dependent on the footprint of the cell in which said electrode will be incorporated. Exemplary electrode dimensions of the main body of the electrode, which comprises the electrochemically active area, are in the range of 0.5 cm² to 1500 cm², preferably 30 cm² to 150 cm², for example 50 cm² to 80 cm². Exemplary lengths of an electrode (inclusive or exclusive of an electrode tab) may be in the range of 1 cm to 30 cm, preferably 5 cm to 25 cm, for example 10 cm to 20 cm. Exemplary electrode widths may be in the range of 1 cm to 40 cm, preferably 5 cm to 30 cm, for example 10 cm to 20 cm.

Typically, the electrode comprises a tab, wherein the tab is a portion of the electrode which does not take part in the electrochemical process during cycling of a cell. It may protrude from an edge of the main body of the electrode and is used to form the mechanical base for a weld to a contact lead. In one embodiment, the width of the tab is less than the width of the main portion of the electrode that includes the electrochemically active area. Alternatively, the width of the tab may be the same as that of the main body of the electrode that includes the electrochemically active area. This electrochemically active area may comprise a layer of alkali metal that is present on the current collector, for example.

Exemplary dimensions of the electrode tab width are in the range of 0.5 to 5 cm, and exemplary dimensions of the electrode tab length are in the range of 1 to 6 cm. The tab forms a part of the current collector and, preferably, at least a portion of the electrode tab is not coated with alkali or alkaline earth metal or metal alloy. During the method of the present invention, at least a portion of the electrode tab remains uncoated by any protective layers. In a preferred embodiment of the invention, a metal foil is supplied that is partially plated with an alkali metal, for example lithium. During cutting, the metal foil is cut such that the coated region forms the main body of the electrode, i.e. the electrochemically active area, and the uncoated region forms the electrode tab.

Instead of initially cutting the substrate material to form one or more current collectors (step b)), the substrate material may initially be cut into sections having dimensions larger than that of a single electrode. For example, where the substrate material is cut into larger sections, each section may have a width of from 0.1 cm to 100 cm, preferably 10 cm to 75 cm, for example, 25 cm to 50 cm. Each section may have a length of from 0.1 cm to 10,000 cm, preferably 10 cm to 1000 cm, for example 100 cm to 500 cm. For example, each portion may have a width of 4 cm to 15 cm, and a length of from 4 cm to 15 cm. In this embodiment, following application of one or more protection layers, each section is then subject to a further cutting step, in which the substrate material is cut to form one or more electrodes, wherein the electrode(s) have dimensions as specified above, and preferably include an electrode tab as detailed above. In this further cutting step, regions of the substrate material overlapped by the carrier or mask are cut, such that cutting is restricted to regions of the substrate material uncoated by the protective layer or layers. Initially cutting larger sections and having a further cutting step after the protection layers have been applied may enable easier handing of the substrate material, for example a metal foil or polymer film, in particular at the initial pick-and-place and (pre)treatment steps. Cutting of the material into sections, and further cutting said material to form one or more electrodes, may be performed by any suitable cutting method as detailed above.

The present inventors have surprisingly found that the method in accordance with the present invention may provide an improved method for producing electrodes, in particular those with a protective coating. Typically, electrodes are cut after electrode coating has been performed. However, this may result in a number of processing difficulties and other disadvantages. For example, where a current collector (optionally including a coating layer of alkali or alkaline earth metal) is coated with one or more coating layers, and this coated current collector is then cut to form one or more electrodes, the cutting process may result in cracks or defects in the coating layers, particularly around the edges of the electrodes. This can be a result of deformation of the substrate material during cutting or manipulation. Where the current collector includes a coating layer of alkali/alkaline earth metal such as lithium, melting of this layer may also occur, for example around the cutting regions. Deformation of the substrate can also manifest additional stresses and strain to the protection layers during cutting and manipulation, which may result in damage to the protection layer. For example, ceramic coating layers may be brittle and may crack if the substrate is subject to deformation, such as bending or stretching, during processing.

Cracks or defects in the coating layers of an electrode may be disadvantageous, as they may prevent a coating layer from effectively performing a protective function during cycling of a cell comprising said electrode. For example, defects in the coating layers of an electrode, for example an anode in a lithium-sulfur cell which comprises a current collector of an electronically conducting, inert metal or non-metal and a lithium coating layer, can allow contact of the lithium metal with the electrolyte, allowing a resistive layer to form on the electrode that may create uneven current density across the electrode surface and ultimately lead to cell drying and/or may decrease battery performance over time, and may also result in the formation of metal dendrites/mossy deposits during cycling. This can result in short-circuiting and decreased cycling performance. Thus, the performance and/or lifetime of such cells may be affected.

In the present invention, cutting of a protective layer or layers is avoided. In accordance with the aspect of the invention in which the current collectors are cut before the protection layer(s) are applied (steps a) to e)), no further cutting is required after coating. In the aspect in which one or more electrodes are cut from a section of substrate material onto which protected regions have been applied (steps i) to v)), the cutting step involves cutting along the regions that have been masked by the carrier during treatment stages. Thus, cutting of the protection layer(s) is avoided.

Prior to the application of one or more protection layers, a current collector may be placed on a carrier (step c)). In one embodiment, a plurality of current collectors is placed on the carrier. Where at least one current collector is placed on a carrier, the current collector or current collectors may lie flat on the carrier. Alternatively, in one embodiment, at least one region of the current collector may be covered or masked such that, on application of a protection layer, no protection layer will be applied to the covered or masked area. In one embodiment, a current collector is placed in a carrier, wherein the carrier overlaps the edges of the current collector.

The carrier systems and/or masking systems used in accordance with the present invention are in electrical isolation from the chamber in which coating takes place. Either the carrier or masking system may optionally be biased with reference to ground or the deposition sources. Additional masks may be applied to the carrier unit at various stages during the coating process. These may be applied by any suitable method, for example a mask may be clipped onto the carrier, or held or fixed within the deposition chamber during coating. In accordance with embodiments of the invention, the mask or masks may be: electronically conductive and in electronic connection to the carrier; electronically conductive and electronically floating whilst being insulated from the carrier; electronically conductive and biased against the carrier or the source whilst being insulated from the carrier; electronically conductive and electronically grounded whilst being insulated from the carrier; electronically insulating and isolated from the carrier and source.

In accordance with step ii) as described above, a substrate material is inserted into a carrier, wherein the carrier comprises one or more openings, such as between 2 to 100, preferably between 5 to 50, for example between 10 to 20, and wherein each opening defines the electrochemically active zone of an electrode. FIG. 1 depicts a carrier into which a section of the substrate material can be inserted.

The carrier may be formed of any suitable material, for example a metal such as aluminium, copper or stainless steel or a non-metal such as a polyetherketone (PEK). In some embodiments, an appreciably inert coating may be present on the carrier, for example aluminium nitride or a polymer coating such as a polyamide-imide (for example Torlon®).

The carrier can be configured so as to contain one or more current collectors therein. In one embodiment, one current collector is placed on, or inserted in, a carrier. In an alternative embodiment, a plurality of current collectors may be placed on, or inserted in, a single carrier. Alternatively, the carrier is configured so as to contain a section of the substrate material therein.

Preferably, the carrier comprises a double-sided masking system, allowing both sides of the substrate to be coated simultaneously. In addition, the use of a carrier may enable the substrate to be held in place during pre-treatment and/or coating steps. This can prevent tension (which can occur during a roll-to-roll process) affecting the substrate, for example a metal foil or polymer film, during processing, and can reduce or prevent uneven thickness of the resulting electrode. In addition, contact between the substrate and the carrier can enable thermal energy exchange between the substrate and the carrier. This may be of particular importance when the substrate is a metal foil. Optionally, the carrier may be in thermal contact with a thermally-controlled heat sink or cooling system. Heating of the substrate may be reduced or minimised, for example during pre-treatment or coating steps.

Additionally or alternatively, masking may be performed by use of a "shadow" masking system. In this embodiment, the edges of the current collector are overlapped by a mask that is not affixed to the carrier. In this masking system, a mask may be present between the electrode and the source of coating material. For example, the mask may be held or suspended in between the carrier and the coating source, and may take the form of a plate as described above. However, the mask is not attached to the carrier, and does not hold the electrode in place during coating. In this masking system, the edges of the electrode are overlapped by the mask such that the edges of the electrode remain uncoated.

Preferably, the carrier comprises two plates, i.e. one plate that is located on one side of the substrate, and one plate that is located on the other side of the substrate. The plates may either be attached together, for example using a hinge, or the two plates may not be joined together, and may be attached once the substrate has been inserted between them. The plates may be attached by any suitable means, for example a clasp or locking arrangement. In one example, the locking arrangement may comprise screws that extend through of the plates. Each plate comprises one or more openings. Each opening defines an electrochemically active zone of a resulting electrode. Alignment pins may be included within the carrier so as to ensure alignment of the plates on each side of the carrier, thus ensuring substantial alignment of the openings on each side of the carrier. In this embodiment, the substrate is held in place in the carrier. Optionally, pressure may be applied to at least a region of the substrate overlapped by the carrier. For example, where a substrate material (for example a current collector comprising a tab) is present in the carrier, pressure may be applied in the tab region. This pressure may be useful to enable good thermal connection between the electrode/foil, the carrier and a heat sink or cooling system.

Where the substrate has been cut to form a current collector (step b)), each current collector may be placed in an individual carrier, wherein the carrier comprises two plates that are positioned on each side of the current collector. Each plate has an opening that defines the electrochemically active zone of the electrode. When the current collector is placed in the carrier, the openings of each plate are preferably aligned such that the exposed areas on each side of the current collector are substantially aligned with each other. Consequently, on application of one or more protection layers to the current collector, the exposed areas of the current collector, i.e. those that form the electrochemically active zone as defined by the opening, are coated.

The carrier may overlap an edge region of the current collector. Preferably, this overlapping region extends around the entirety of the outer perimeter of the current collector. During application of one or more protection layers to the current collector, the overlapped region of the current collector is not coated, as this region is masked by the carrier. The electrode tab is additionally masked by the carrier, and is not coated with the protection layer(s). Following coating (step d)), the protection layers on each side of the resulting electrode are substantially aligned with each other.

Figure 2:
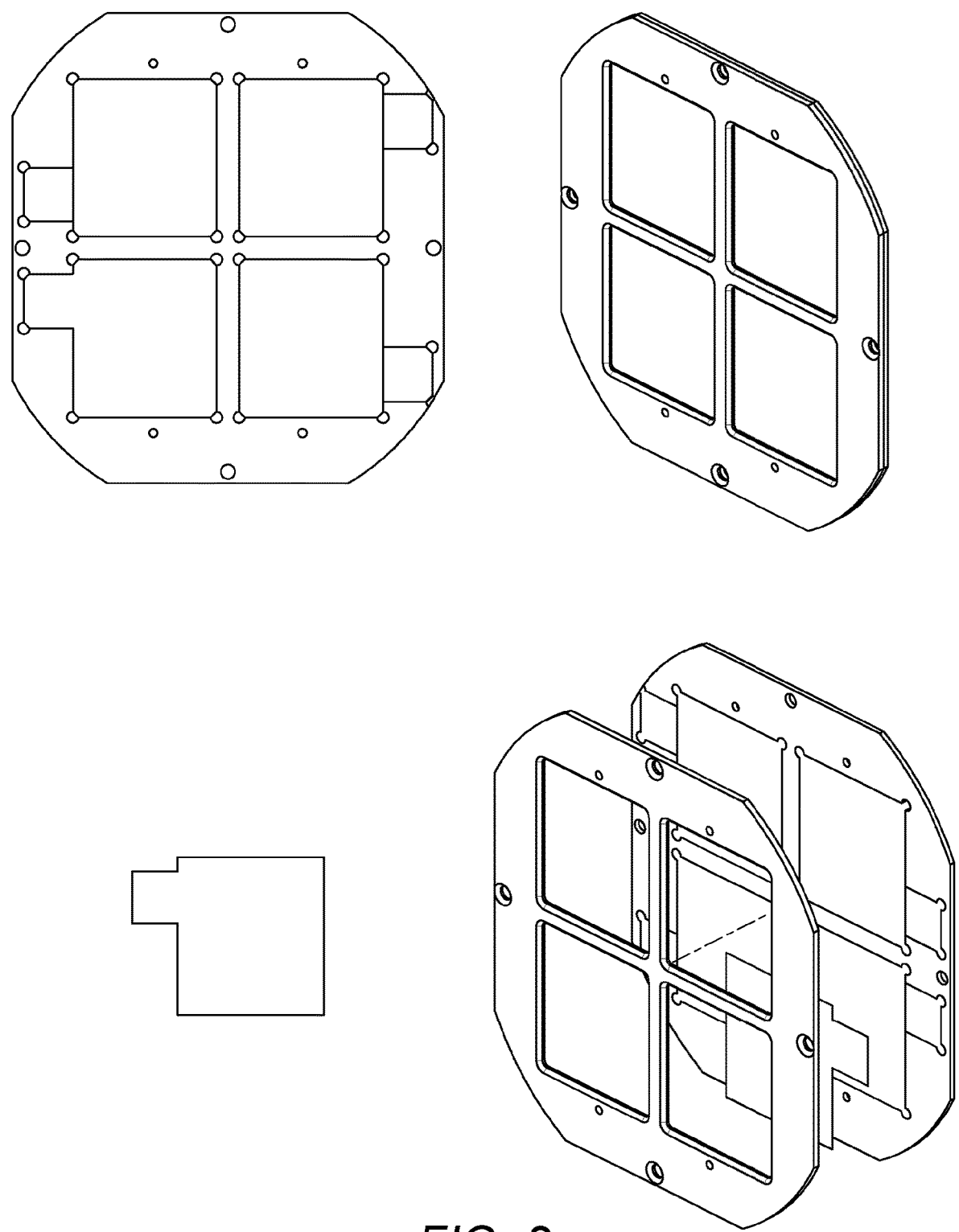
FIG. 2 depicts a carrier for use in a method in accordance with an embodiment of the present invention.

Alternatively, a plurality of current collectors may be placed in a single carrier, wherein each side of the carrier has a plurality of openings that each define the electrochemically active zone of one electrode. Each opening is substantially aligned with an opening on the other side of the carrier, such that the exposed areas on each side of each current collector are substantially aligned when one or more current collector are placed in the carrier. Consequently, on application of one or more protection layers to the one or more current collectors present in the carrier, the exposed areas of each current collector, i.e. those that form the electrochemically active zone as defined by the opening, are coated. Following treatment stages, the resulting protection layers on both sides of each electrode are substantially aligned with each other. FIG. 2 shows an arrangement in which four current collectors may be placed in a single carrier.

Alternatively, a section of substrate material may be placed in a carrier, wherein each side of the carrier has a plurality of openings that each define the electrochemically active zone of one electrode. Each opening is substantially aligned with an opening on the other side of the carrier, such that exposed areas on each side of the substrate material are substantially aligned when the foil is placed in the carrier. In one embodiment, the section of metal foil is held in place in a carrier comprising two plates as detailed above. In another embodiment, the section of metal foil is place on a carrier and a "shadow" mask is used to overlap or cover the areas of metal foil that do not define the electrochemically active zone of the resulting electrode or electrodes. Consequently, on application of one or more protection layers to the substrate material present in the carrier, the exposed areas of the foil, i.e. the areas that form the electrochemically active zone of discrete electrodes, are coated. Following coating, the exposed, coated areas on each side of the substrate material are substantially aligned with each other. In between the coated areas are uncoated areas that were covered by the carrier during application of the protection layer. Following removal of the substrate material from the carrier (step iv)) the material is cut to form one or more electrodes (step v)). Each of said one or more electrodes has an electrochemically active zone coated with one or more protection layers. An electrochemically active zone may be present on either one or two sides of each electrode. Preferably, an electrochemically active zone is present on both sides of the electrode. The substrate material is cut along the uncoated areas of the foil, i.e. the areas that were covered or masked by the carrier. Thus, the coated areas are not cut. No damage to the protection layer results from cutting. Following cutting, each electrode may have an outer region that is not coated with a protection layer. The dimensions of the outer, uncoated region may vary; for example, the uncoated region following cutting may extend from between 0.01 mm and 20 mm. The dimensions of the uncoated region may vary around of the perimeter of the electrode. Preferably, the uncoated region extends around the entire perimeter of the electrode. Preferably, the uncoated region is present on both sides of the electrode.

Alternatively, where one or more current collectors is placed on a carrier, i.e. where the current collector(s) lies flat on a carrier and wherein the top of the current collector(s) is not partially covered, the entire upper surface of the current collector(s) may be coated. In this embodiment, the coated electrode does not have an outer region that is not coated with a protection layer. Following coating of the upper surface of the electrode, the electrode may be turned such that the other surface of the electrode may be coated.

Optionally, following production of one or more coated electrodes, the outer electrode region that is not coated with the protection layer may be coated with an electronically and ionically insulating material to render it inactive when the electrode is included within an electrochemical cell. Preferably, the electrode tab is not coated with an insulating material. In one embodiment, an insulating material such as an insulating polymer may be applied to the uncoated edge region by, for example, spray coating or printing. An optional thermal or curing step may be performed after the application of insulation material. This step may serve to polymerise the insulating material.

Additionally or alternatively, when the electrode is in situ in an electrochemical cell, the outer, uncoated electrode region may be inactive due to the relative dimensions of the positive and negative electrodes. For example, a coated anode having an outer, uncoated region may be matched with a cathode of a smaller area, such that the electrochemically active area of the cathode is matched with only the electrochemically active, coated area of the anode. The uncoated, outer region is not aligned with the electrochemically active area of the cathode.

As detailed above, the carrier may comprise one or more openings that define an electrochemically active zone of an electrode. During application of one or more protection layers, the exposed areas of the current collector(s) or substrate material, i.e. the areas not covered by the carrier or masking system (for example, by a shadow mask as previously described), are coated. The areas of the current collector(s) or substrate material that are covered by the carrier remain uncoated. At least one region of a current collector may be overlapped or covered by the carrier. Where a single current collector is placed in an individual carrier, the edges of the current collector are preferably covered by the carrier on each side (i.e. the upper and lower side). In one embodiment, an area of between 0.01 mm and 20 mm, preferably between 0.1 mm and 10 mm, for example between 0.5 and 1 mm extending from the edge of the main body of the current collector is covered by the carrier.

Where the current collector has been cut before coating (step b)), the electrode tab, or a portion of the electrode tab, is preferably overlapped by the carrier. During application of a protection layer or layers, the electrode tab, or covered portion of the electrode tab, is not exposed to the material applied during coating, and therefore remains uncoated by a protection layer. In avoiding the formation of a protection layer on at least a portion of the electrode tab, better mechanical and/or electrical contact between the electrode tab and a contact lead may be achieved.

Figure 3:
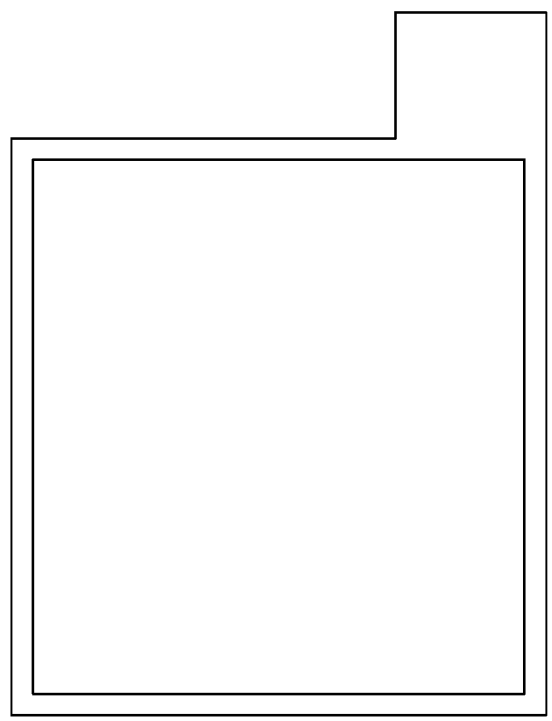
FIG. 3 depicts a protected electrode produced by a process in accordance with an embodiment of the present invention.

At least one region of the current collector may be overlapped by the carrier, as described above. FIG. 3 depicts a protected electrode produced by the process in accordance with an embodiment of the present invention. In FIG. 3, the electrode tab is formed of an inert material that is not coated by a protection layer. A region of the electrode body is coated with a protection layer. The perimeter of the electrode body is not coated by the protection layer. The uncoated regions of the electrode were covered by the carrier system during application of the protection layer(s). It will be understood that the other side of the electrode (not visible in figure) has equivalent regions that are coated/uncoated.

The electrode may be coated with any suitable protection layer. At least one or more coating layers may be envisaged. This coating may form an anode protection layer. Such an anode coating layer may have beneficial effects on cell performance, for example by reducing inhomogeneous stripping and plating of alkali metal present in the anode, which may reduce cracks or voids in the anode surface and may provide improvements in capacity and cycle life. The thickness of each coating layer may be between 1 nm and 5000 nm, preferably between 10 nm and 3000 nm, more preferably between 100 nm and 1000 nm, for example between 100 nm and 500 nm. Preferably, both sides of the electrode (or both sides of the metal foil from which one or more electrodes is produced) are coated. In one embodiment, both sides are coated simultaneously. In another embodiment, a coating layer or layers is first applied to one side of the electrode (or metal foil). Following this initial application step, a coating layer or layers is then applied to the other side of the electrode or foil.

For example, one or more coating layers comprising at least one metal and/or non-metal that can form an alloy with an alkali metal such as lithium or sodium may be employed. The term "alloy" refers to a combination of two or more metals, or a combination of one or more metals with other, non-metallic elements. Examples of suitable alloying metals and non-metals include aluminium, gallium, boron, indium, zinc, carbon, silicon, germanium, tin, lead, antimony, silver, gold, sodium, potassium, magnesium, calcium, palladium, platinum and mixtures thereof. The thickness of the coating layer comprising at least one metal and/or non-metal that can form an alloy with an alkali metal such as lithium or sodium may be between 1 nm and 5000 nm, preferably between 10 nm and 3000 nm, for example between 100 nm and 1000 nm. In one embodiment, a coating layer comprising at least one metal and/or non-metal that can form an alloy with an alkali metal is deposited directly on the electroactive active alkali metal layer.

Additionally or alternatively, one or more ionically conducting coating layers may be applied to the electrode, either directly on an electroactive active alkali metal layer, or on top of a further coating layer. Said ionically conducting coating layer may have an electronic conductivity of less than $10^{-5}$ S cm$^{-1}$. Thus, this layer may have a low electronic conductivity, i.e. be substantially electronically insulating. The inclusion of a layer with a low electronic conductivity may avoid electrochemical reduction of alkali metal ions such as Li$^+$ and Na$^+$ on top of a layer comprising at least one metal and/or non-metal that can form an alloy with an alkali metal such as lithium or sodium, where such a layer is present between the ionically conducting coating layer and the anode. Low electronic conductivity may also serve to prevent the ionically conducting coating layer from effectively working as a further current collector within the cell. The ionically conducting coating layer may have an electronic conductivity of less than $10^{-5}$ S cm$^{-1}$, preferably less than $10^{-8}$ S cm$^{-1}$, more preferably less than $10^{-10}$ S cm$^{-1}$. In one example the electronic conductivity is less than $10^{-12}$ S cm$^{-1}$. Said ionically conducting coating layer may have a thickness of between 1 nm and 5000 nm, preferably between 10 nm and 1000 nm, for example between 100 nm and 500 nm.

The ionically conducting coating layer may comprise at least one of a ceramic or glass material, a polymer material, a polymer and ceramic composite material, and combinations thereof. Suitable ceramic or glass materials include, for example, one or more elements selected from lithium, sodium, magnesium, oxygen, phosphorous, nitrogen, silicon, germanium, titanium, zirconium, tin, aluminium, sulfur, boron, selenium, fluorine, chlorine, bromine or iodine. Suitable ceramic materials may be stoichiometric or non-stoichiometric. The ceramic material may be an oxynitride, sulphide, phosphate, oxide, oxysulfide, thiophosphate, borate, oxyborate, borohydride, silicate, aluminate or thioaluminate compound, or a combination thereof. Examples of suitable materials include lithium oxynitride, lithium sulphide, lithium phosphate, lithium oxide, lithium oxysulfide, lithium thiophosphate, lithium borate, lithium oxyborate, lithium borohydride, lithium silicate, lithium aluminate and lithium thioaluminate, or combinations thereof. Alternatively, the material may be selected from one or more of sodium oxynitride, sodium sulphide, sodium phosphate, sodium oxide, sodium oxysulfide, sodium thiophosphate, sodium borate, sodium oxyborate, sodium borohydride, sodium silicate, sodium aluminate and sodium thioaluminate. The ceramic material may be an amorphous material.

The ionically conducting coating layer may comprise a conductive polymer material, for example an ionically conductive polymer. Additionally or alternatively, the ionically conducting coating layer may comprise a polymer material having an alkali metal salt distributed within the polymer material. This may provide or increase ionic conductivity within the polymer. The ionically conducting coating layer may instead or additionally comprise a polymer-ceramic composite material. A polymer-ceramic composite material may comprise ceramic particles that are bound together by at least one polymer material. The polymer or polymers used to form the polymer-ceramic composite material may have inherent alkali metal ion conductivity, or may be mixed with alkali metal salts.

For example, the polymer material may comprise a lithium salt (e.g. LiTFSI) dissolved within a polymer phase, for example polyethylene oxide. Further examples of lithium salts include lithium hexafluorophosphate, lithium hexafluoroarsenate, lithium nitrate, lithium perchlorate, lithium trifluoromethanesulfonimide, lithium bis(oxalate) borate and lithium trifluoromethanesulphonate. Suitable sodium salts include sodium hexafluorophosphate, sodium hexafluoroarsenate, sodium nitrate, sodium perchlorate, sodium trifluoromethanesulfonimide, sodium bis(oxalate) borate and sodium trifluoromethanesulphonate. Combinations of salts may be employed.

The polymer may comprise at least one functional group selected from the list of amine, amide, carbonyl, carboxyl, ether, thioether and hydroxyl groups, and mixtures thereof. Non-limiting examples of polymers include polyanhydrides, polyketones, polyesters, polystryenes, polyamides, polyimides, polyurethanes, polyolefins, polyvinylenes. Non-limiting examples of ionically conductive polymers may include nitrogen or sulfur containing polymers, for example polypyrroles (PPY), polycarbazoles, polyindoles, polyazepines, polyanilines, polythiophenes, PEDOT, PPS. Further examples of ionically conductive polymers may include poly(fluorene)s, polyphenylenes, polypyrenes, polyazulenes, polynaphthalenes, poly(acetylene)s (PAC) and poly (p-phenylene vinylene) (PPV). In a preferred embodiment, the polymer material is polyethylene oxide.

In a preferred embodiment, the electrode is coated with a first layer comprising a metal and/or non-metal that alloys with an alkali metal, and a second layer deposited on the first layer, wherein the second layer is an ionically conducting layer having an electronic conductivity of less than $10^{-5}$S cm$^{-1}$, wherein the first and second layers are as detailed above. Coatings comprising more than one of either the layer comprising a metal and/or non-metal that alloys with an alkali metal, or the ionically conducting layer, may be envisaged. Additional layers may also be included.

Any suitable method may be used to form the coating layer or layers. Examples of suitable methods include physical or chemical deposition methods, such as physical or chemical vapour deposition. For example, plasma-enhanced chemical vapour deposition, sputtering, evaporation, electron-beam evaporation, pulsed laser deposition (PLD) and chemical vapour deposition (CVD) may be used. Alternative methods of forming coating layers may include ink-jet printing, screen printing, slot die and spray coating. Following deposition of each of the coating layers, drying may be performed.

In one embodiment, one or more anodes are produced by the method of the present invention. In one embodiment, the anode comprises a current collector formed of an electronically conductive, inert material, and a protection layer comprising an anode active material layer which is alloyable with an alkali metal or forms a compound with an alkali metal. The anode may not initially include an alkali metal coating on the current collector. For example, a nickel current collector may be coated with a metal such as tin, silver or gold, or a carbon material. Optionally, the anode may further comprise a ceramic or polymer layer, wherein the ceramic or polymer layer is ionically conducting and electronically insulating.

In advance of the application of the one or more coating layers, a pre-treatment step may be performed on the current collector, or in particular on a layer alkali metal or alkaline earth metal coating on the current collector. For example, pre-treatment may be used to remove or reduce the impurities present on the surface of an alkali metal foil such as lithium or sodium. This pre-treatment step can prepare the metal surface for the coating step. For example, pre-treatment may improve the interfacial characteristics of the resulting electrode, such as ensuring better adhesion of the first coating layer to the alkali metal foil. For example, pre-treatment of a metal foil, such as an alkali metal foil, may involve contacting the foil with a reactive gas or gas mixture. Examples include $H_2$, $CO_2$, $N_2$, $O_2$, $SO_2$, $H_2O$, $H_2S$, $Cl_2$, $F_2$, $POCl_3$, and $PH_3$. Alternatively, pre-treatment may involve contacting a metal foil (e.g. an alkali metal foil) with a solvent, for example an organic solvent such as heptane or hexane, or an ionic solvent such as 1-Butyl-3-methylimidazolium hexafluorophosphate. Plasma cleaning may also be employed. Pre-treatment may be performed at atmospheric pressure, under reduced pressure or under vacuum conditions. Any one or more of said pre-treatments may be employed before application of the first coating layer. A pre-treatment step may be performed at any suitable time before coating, for example any one or more of said pre-treatments may be employed prior to insertion of the electrode/foil into the carrier, and/or following insertion into the carrier. In one embodiment of the present invention, plasma cleaning is preferably performed under vacuum, before the carrier is transferred under vacuum into a treatment zone wherein one or more protection layers are applied. Additionally, plasma treatment steps may optionally be applied between the subsequent coating steps to improve the surface properties of coated layers or enhance the interface of between deposited layers.

In accordance with one embodiment of the present invention, the following method is used to produce one or more electrodes:

Thin (e.g. 20-150 μm) metal foil (e.g. nickel or copper foil) is cut into the desired electrode footprint by means of a suitable technique, for example laser or mechanical cutting. The metal foil forms the current collector of an electrode, and is coated with an alkali metal (e.g. lithium) on both sides of the main body of the current collector. The current collector comprises an electrode tab that is not coated with alkali metal. Optionally, a pre-treatment step may be performed to prepare the surface for the coating step.

The cut and optionally pre-treated current collector is loaded into a carrier such that both faces of the intended electrochemically active area of the electrode are exposed, and wherein the rest of the electrode is masked.

The carrier is passed through multiple treatment zones where the electrode is treated. First, an optional pre-treatment step may be performed in order to prepare the electrode surface for the coating step. This pre-treatment step may include various processes and environments (solvent, vacuum, reactive gas etc). The final pre-treatment step is performed under vacuum, involving applying a plasma cleaning process. Then the carrier is transferred under vacuum into a treatment zone where one or more protective layers are applied under vacuum to the surface of the electrode.

The carrier is removed from the vacuum, and the electrode, comprising one or more protection layers, is unloaded from the carrier. The electrode is then picked and placed for cell build. An optional step of coating the uncoated edge regions of the electrode with an insulating polymer may be performed prior to cell build. An additional thermal/curing step may also be performed.

Figure 4:
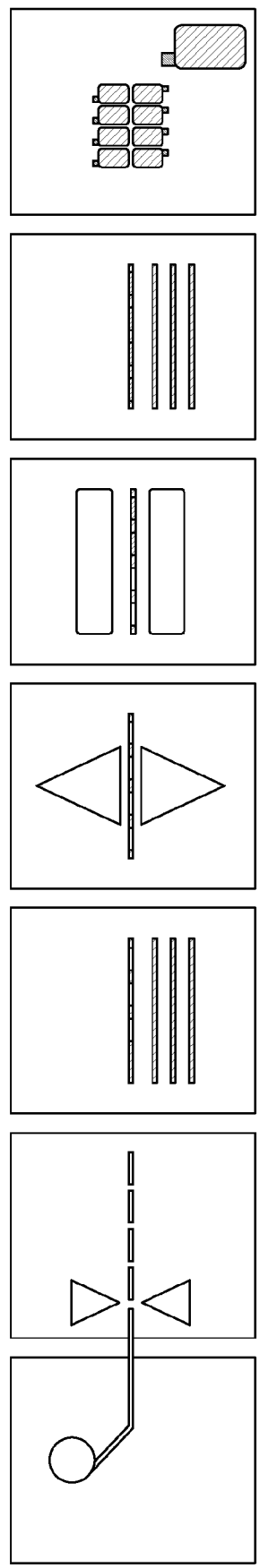
FIG. 4 provides a schematic representation of a method of forming one or more electrodes in accordance with an embodiment of the invention.

FIG. 4 provides a schematic representation of a method in accordance with an embodiment of the present invention. Said method includes the following steps: 1) unwinding a reel of metal foil, wherein the foil is partially coated with lithium; 2) cutting a current collector having the desired electrode footprint from the foil; 3) pick & place of current collector on substrate carrier/masking system; 4) pre-treatment and coating deposition within a vacuum system; 5) pick & place of the protected Li electrodes for cell build. Said method may be similarly applied to the production of an alternative alkali metal electrode, such as sodium. In this case, step 1) would include an Na coating on the current collector. Said method may be similarly applied to the production of a magnesium metal electrode, in which case step 1) would include an Mg coating on the current collector.

In accordance with another embodiment of the present invention, the following method is used to produce one or more electrodes:

Thin (e.g. 5-150 micron) metal foil (e.g. nickel or copper foil) is cut into the desired footprint by means of a suitable technique, for example laser or mechanical cutting, wherein the desired footprint is a section of foil that is larger than a single electrode. The metal foil is partially coated with an alkali metal (e.g. lithium) on both sides. By providing a partially coated metal foil, electrodes may be cut such that, following cutting, at least a portion of the tab region is obtained from the uncoated region, and the main body of the electrode is obtained from the coated region of the foil. Optionally, a pre-treatment step may be performed to prepare the surface of the foil for the coating step.

The section of foil is loaded into a carrier such that openings on each side of the carrier define intended electrochemically active areas of one or more electrodes, wherein the intended electrochemically active areas are exposed and the rest of the foil is masked.

The carrier containing the current collector is passed through multiple treatment zones where the exposed areas of the foil are treated. First, an optional pre-treatment step may be performed in order to prepare the surface for the coating step. This pre-treatment step may include various processes and environments (solvent, vacuum, reactive gas etc). In one embodiment, the final pre-treatment step is performed under vacuum, involving applying a plasma cleaning process. Then the carrier is transferred under vacuum into a treatment zone where one or more protective layers are applied under vacuum to the exposed areas of the foil.

The carrier is removed from the vacuum, and the foil, comprising one or more protection layers in areas that define the electrochemically active areas of one or more electrodes, is unloaded from the carrier.

The foil is cut to provide one or more electrodes having a desired electrode footprint, by cutting along the uncoated regions of the foil.

The electrodes are then picked and placed for cell build. An optional step of coating the uncoated edge regions of the electrodes with an insulating polymer may be performed prior to cell build. An additional thermal/curing step may also be performed.

Figure 5:
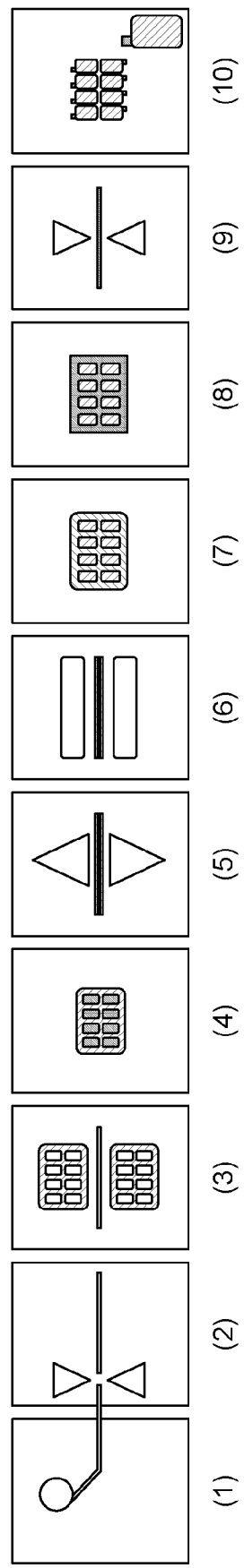
FIG. 5 provides a schematic representation of a method of forming one or more electrodes in accordance with a further embodiment of the invention.

FIG. 5 provides a schematic representation of a method in accordance with another embodiment of the present invention. Said method includes the following steps: 1) unwinding a reel of substrate material, wherein the material is partially coated with lithium; 2) cutting sections of substrate material (optional); 3 and 4) pick and place of section on substrate carrier/masking system; 5) pre-treatment and 6) coating deposition on foil section within a vacuum system; 7 and 8) removal of carrier/masking system; 9) cutting protected electrodes from foil section; 10) pick & place of the protected electrodes for cell build. Said method may be similarly applied to the production of an alternative alkali metal electrode, such as sodium, or an alkaline earth metal electrode such as magnesium.

Figure 6:
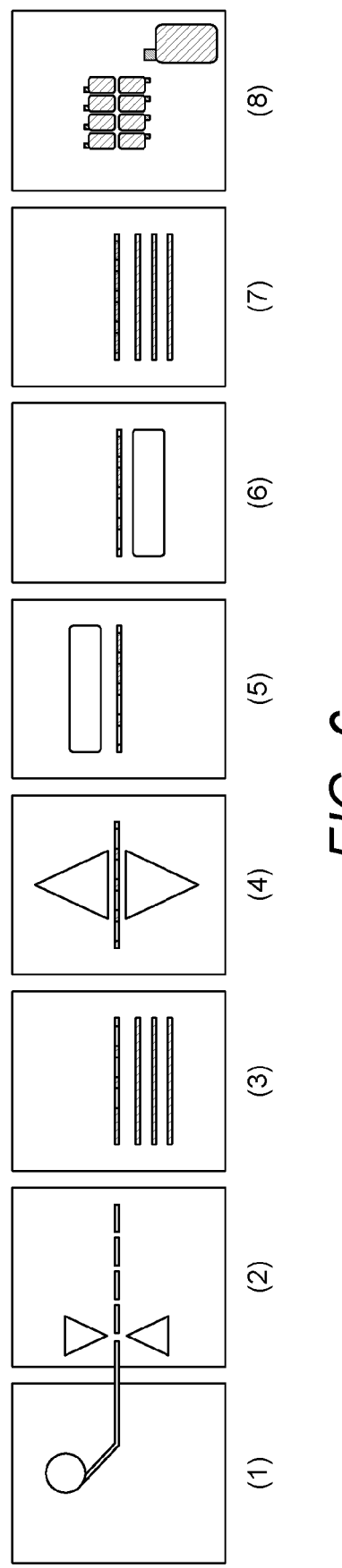
FIG. 6 provides a schematic representation of a method of forming one or more electrodes in accordance with a further embodiment of the invention.

FIG. 6 provides a schematic representation of a method in accordance with a further embodiment of the present invention. Said method includes the following steps: 1) unwinding a reel of substrate material, wherein this is partially coated with lithium; 2) cutting one or more current collectors; 3) placing one or more current collectors on a carrier; 4), 5) and 6) pre-treatment and coating deposition on current collectors within, for example, a vacuum system, wherein first one side and then the opposing side of the current collector is coated; 7) and 8) pick and place of the resulting protected electrodes for cell build.

The electrode formed in accordance with the present invention may be included in an electrochemical cell. The electrochemical cell may be any suitable alkali metal or alkaline earth metal-based cell. Preferably, the electrode is employed as a negative electrode (anode). The negative electrode may be coupled with various positive electrode materials, and may in particular be coupled to any high energy cathode. Non-limiting examples of electrochemical cells include a lithium or sodium-sulfur cell, lithium or sodium ion cell (for example a lithium or sodium-NMC cell), or a lithium or sodium-air cell (for example, a lithium or sodium $O_2$ cell). Preferably, the secondary/ rechargeable electrochemical cell is a lithium-sulfur or lithium-ion cell. Alternatively, the cell may comprise an alkaline earth metal such as magnesium instead of lithium or sodium. Each electrochemical cell may comprise an anode and a cathode, and a liquid or solid electrolyte present between the anode and the cathode. The electrodes formed in accordance with the present invention may be employed in all-solid-state electrochemical cells, as well as cells including liquid electrolytes.

According to an embodiment of the invention there is provided a lithium-sulfur cell comprising an anode produced by the process described herein, a cathode and an electrolyte. Optionally, a separator may be positioned between the cathode and the anode. For example, when assembling the cell, a separator may be placed on the cathode and an anode placed on the separator. Electrolyte may then be introduced into the assembled cell to wet the cathode and separator. Alternatively, the electrolyte may be applied to the separator, for example, by coating or spraying before the anode is placed on the separator. The separator may be formed of a mesh formed of a polymeric material, for example polypropylene, nylon and polyethylene.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The readers attention is directed to all papers and documents which are filed concurrently with or previous to this specification in connection with this application and which are open to public inspection with this specification, and the contents of all such papers and documents are incorporated herein by reference.

The invention claimed is:

1. A method for forming an electrode, said method comprising:
    a) providing an electronically conductive, inert material;
    b) cutting the electronically conductive, inert material to form at least one current collector;
    c) placing at least one current collector on a carrier, wherein the carrier comprises two plates and wherein either one plate, or both plates, comprises at least one opening defining an electrochemically active zone of the electrode, and wherein the at least one current collector is placed between the two plates such that an inner region of each current collector is exposed and an outer region of the current collector is overlapped by the carrier;
    d) applying one or more protection layers to one or both sides of the current collector to form the electrode; and
    e) removing the electrode from the carrier.

2. The method according to claim 1, wherein a plurality of current collectors is placed on the carrier.

3. The method according to claim 1, wherein each current collector comprises an electrode tab.

4. The method according to claim 1, wherein the electrode has a length of between 1 cm and 30 cm and a width of between 1 cm and 40 cm.

5. The method according to claim 1, wherein the carrier is formed of a that is selected from stainless steel, copper or aluminium.

6. The method according to claim 1, wherein the region of overlap of the carrier on the current collector extends from between 0.01 mm and 20 mm from the edge of the current collector.

7. The method according to claim 1, wherein both plates comprise at least one opening defining an electrochemical zone; wherein the openings on each plate are substantially aligned with one another such that each current collector has an exposed area defining an electrochemical zone on both sides, and wherein said exposed areas are substantially aligned with one another; and wherein the one or more protective layers are applied to both sides of the current collector simultaneously.

* * * * *